United States Patent [19]

Siuzdak

[11] Patent Number: 5,040,292
[45] Date of Patent: * Aug. 20, 1991

[54] METHOD OF FORMING DIELECTRIC LAYER ON A METAL SUBSTRATE HAVING IMPROVED ADHESION

[75] Inventor: Allan J. Siuzdak, Cumberland, R.I.

[73] Assignee: Texas Instruments Incorporated, Dallas, Tex.

[*] Notice: The portion of the term of this patent subsequent to Jun. 26, 2007 has been disclaimed.

[21] Appl. No.: 506,420

[22] Filed: Apr. 9, 1990

Related U.S. Application Data

[63] Continuation-in-part of Ser. No. 216,562, Jul. 7, 1988, Pat. No. 4,936,010.

[51] Int. Cl.$^5$ .............................................. H05K 3/34
[52] U.S. Cl. ...................................... 29/840; 29/846; 427/96; 228/123; 428/620
[58] Field of Search ................. 29/829, 830, 840, 846; 427/96, 123; 228/122, 123, 124, 222, 248, 263.18; 174/16.3; 361/386, 388; 428/614, 620, 630, 675; 65/59.1, 59.2, 59.3, 59.5, 43, 60.2

[56] References Cited

U.S. PATENT DOCUMENTS

| | | | |
|---|---|---|---|
| 3,994,430 | 11/1976 | Cusano et al. | 228/122 |
| 4,316,942 | 2/1982 | Kuo | 428/432 |
| 4,717,591 | 1/1988 | Acosta et al. | 427/96 |
| 4,788,627 | 11/1988 | Ehlert et al. | 361/386 |
| 4,811,166 | 3/1989 | Alvarez et al. | 361/386 |

*Primary Examiner*—Carl E. Hall
*Assistant Examiner*—S. Thomas Hughes
*Attorney, Agent, or Firm*—John A. Haug; James P. McAndrews; Melvin Sharp

[57] ABSTRACT

The bond of a layer of glass dielectric material applied to metal substrates of the type which are capable of forming solid solutions with copper is enhanced by first coating the substrate with a layer of thick film copper, curing the thick film at a temperature which results in the formation of the solid solution at the interface between the substrate and the thick film copper and then applying the dielectric layer to the thick film copper and curing the dielectric layer. Circuit patterns and components can then be built on the dielectric layer.

5 Claims, 1 Drawing Sheet

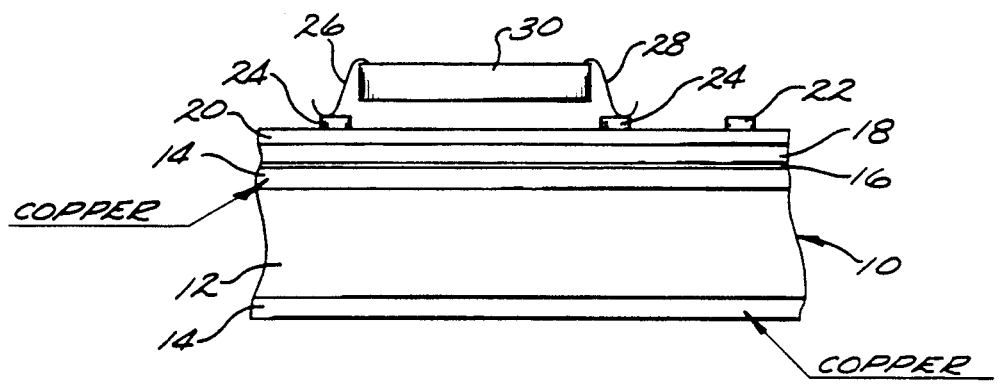

5,040,292

METHOD OF FORMING DIELECTRIC LAYER ON A METAL SUBSTRATE HAVING IMPROVED ADHESION

CROSS-REFERENCE TO RELATED APPLICATION

This application is a continuation-in-part of U.S. pat. application Ser. No. 07/216,562, filed Jul. 7, 1988, now U.S. Pat. No. 936,010.

BACKGROUND OF THE INVENTION

1. Field of the Invention

This invention relates generally to thermally conductive substrates used for disposing circuits thereon and more particularly to substrate having a layer of copper on which a dielectric layer adapted to receive the circuit is disposed.

2. Brief Description of the Prior Art

Various electronic components, such as integrated circuits, tend to generate heat and can be damaged if subjectd to excessive temperatures. A technique to mitigate harmful temperature excursions involves mounting such components and circuits on heat sinks of selected materials.

Certain materials such as Invar or molybdenum sandwiched between layers of copper have been found to be very useful in providing not only effective heat sinking characteristics but also providing an effective thermal coefficient of expansion (TCE) match for components or layers mounted thereon. For some applications such as substrates are subjected to high temperature air furnace environments during processing. For example, when thick film gold pads are provided for wire bonding of an IC the gold is conventionally cured in an air environment. In order to prevent destructive oxidation of the copper during the high temperature excursion it is necessary to apply a protective layer on the copper. Nickel may be used for providing a protective coating which can be subjected to such elevated temperatures in air with negligible deleterious affects. However, a problem occurs in obtaining an adequate bond when forming a glass dielectric layer on the nickel in order to build a circuit on the substrate. The dielectric layer tends to peel away from the nickel making it unsuitable to mount a circuit.

It is therefore an object of the invention to provide a suitable bond between a glass type dielectric layer and a metal substrate. Another object is the provision of forming a glass type dielectric layer on a substrate having a nickel coating thereon which layer is strongly adhered to the substrate to facilitate the building of circuits on the layer. Yet another object is the provision of articles having a copper layer to which is strongly adhered a glass type dielectric coating.

SUMMARY OF THE INVENTION

Briefly, in accordance with the invention, a thick film of copper is placed over the protective nickel layer and is cured in a nitrogen atmosphere to form a solid solution of alpha copper, nickel at the interface of the thick film and the nickel layer. The nickel diffuses into the copper and the copper diffuses into the nickel. A glass type dielectric layer is then formed on top of the thick film of copper with glass frit in the thick film serving to anchor the dielectric layer thereby enhancing the bond of the layer to the substrate. The dielectric layer is then cured in a nitrogen atmosphere to provide a substrate suitable for building circuits thereon including components requiring processing in high temperature oxidizing or slightly reducing atmospheres.

BRIEF DESCRIPTION OF THE DRAWING

The drawing shows a portion of a substrate having a dielectric coating disposed thereon formed in accordance with the invention and shown with a portion of a circuit built on the dielectric layer.

DETAILED DESCRIPTION OF PREFERRED EMBODIMENT

A thermally conductive base 10 having one or more outer layers of copper or copper alloy serves as the starting point for the instant invention. It is intended that the base serve as a heat sink for electronic components and circuits disposed thereon. The base could be a solid piece of copper or other commonly used materials such as Invar, a nickel iron alloy, sandwiched between layers of copper or molybdenum sandwiched betwen layers of copper. Such materials have excellent thermal conductivity as well as selected TCE characteristics. As shown in the drawing base 10 is composed of a central layer of infar or molybdenum 12 sandwiched between cooper layers 14.

As mentioned above, for certain applications an oxidation protection layer 16 is required. This could be a nickel coating applied by conventional techniques, such as by electroplating, having a thickness sufficient to ensure a nonporous layer. Generally a thickness in the order of one hundred microinches is sufficient to provide the desired protection without significantly affecting the thermal conductivity characteristics of the base.

In accordance with the invention the base 10, with a protective nickel layer 16 applied to a copper surface is coated with a thick film layer of copper 18 where it is desired to form the circuit. Although the coating can be applied in any conventional manner, screen printing is effective. The copper coating can have a thickness in the order of 0.06 to 1 mil after curing.

A nitrogen fireable copper ink which comprises copper particles, glass frit and a binder is applied in a conventional manner as by printing on the nickel layer and is then fired at approximately 900° C. in an essentially oxygen free nitrogen atmosphere. The copper and nickel at the interface therebetween forms a binary alloy system with alpha copper and nickel in a solid solution. Nickel diffuses into the copper layer and copper diffuses into the nickel layer to obtain an excellent bond of copper to the nickel. A glass dielectric, nitrogen firable ink is then applied to the outer surface of he cured thick film copper, as by printing and fired in a nitrogen atmosphere. The glass frit in the thick film copper serves as seed or anchor points for the dielectric layer 20 with the result that dielectric layer is strongly adhered to the thick film copper.

Conventional circuit paths 22 can then be deposited on dielectric layer 20 as well as gold pads 24 to facilitate bonding of leads 26, 28 of electronic component 30 thereto.

In accordance with the invention Invar sandwiched between and metallurgically bonded to first and second layers of copper were plated with 100 microinches of watts nickel. These were ultrasonically cleaned in IPA, dried and thermally cleaned in a nitrogen atmosphere having less than 10 ppm of oxygen 900° C. Separate samples were prepared with Dupont de Nemours copper thick film ink 9922, 9924M and 9153 and cured at 900° C. in a nitrogen atmosphere having less than 10 ppm oxygen. A layer of glass dielectric, Dupont de Nemours 4575D was then applied and cured at 900° C. in a nitrogen atmosphere having less than 1 ppm oxygen. Adhesion of the dielectric layers to the thick film copper was excellent.

Similar samples were made using sulfamate nickel on the same substrate and were processed as in the last paragraph with particularly good results obtained with thick film ink 9922.

It will be understood where the protective layer of nickel is not required that an improved bond of the dielectric material applied to a copper base can be obtained by applying a thick film of copper to the copper base layer, forming a bond between the two copper layers by a conventional curing step to promote interdiffusion between the copper layers, and still obtain the benefit of the glass frit in the copper thick film serving to anchor the dielectric layer.

It will also be understood that metal layers other than nickel could be used to form a layer in which solid solutions would be formed with the thick film copper as long as the TCE of the copper thick film and the metal are not too disparate. Examples of this include titanium and Kanthal, a trade mark of C. O. Jelliff Mfg. Corporation for a high electrical-resistance iron alloy. It is believed that solid solutions of copper and titanium and copper and iron of the Kanthal alloy contribute to an improved bond between copper and the respective metal layer while the glass frit in the thick film copper enhances the bond of the glass dielectric layer to the thick film copper. The above identified copper inks 9922, 9924M and 9153 were separately applied to titanium and Kanthal alloy, cured at 900° C. in a nitrogen atmosphere having less than 10 ppm oxygen with a further coating of 4575D glass dielectric cured. This resulted in dielectric coatings strongly adhered to the base.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed:

1. A method of forming a glass type dielectric layer on a metallic substrate having an improved bond thereto comprising the steps of providing a base having an outer layer of copper, applying a layer of thick film copper comprising copper particles and glass frit on the outer layer of copper, curing the thick film copper in a nitrogen atmosphere thereby bonding the thick film copper to the base copper, coating the thick film copper with a thick film of a glass type dielectric material and curing the dielectric material in nitrogen atmosphere thereby bonding the glass frit to the glass type dielectric material.

2. A method according to claim 1 further including the step of forming an electrically conductive circuit path on the dielectric material.

3. A method according to claim 2 further including the steps of mounting an electronic component on the dielectric layer and connecting the component to selected portions of the circuit path.

4. A method according to claim 1 in which the thick film copper is selected from the group consisting of Dupont de Nemours ink 9922, 9924M and 9153.

5. A method according to claim 4 in which the thick film glass type of dielectric material is Dupont de Nemours ink 4575D.

* * * * *